(12) United States Patent
Kim

(10) Patent No.: US 6,252,279 B1
(45) Date of Patent: Jun. 26, 2001

(54) DMOS TRANSISTOR HAVING A HIGH RELIABILITY AND A METHOD FOR FABRICATING THE SAME

(75) Inventor: Min Hwan Kim, Bucheon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/376,710

(22) Filed: Aug. 17, 1999

(30) Foreign Application Priority Data

Aug. 18, 1998 (KR) .................................................. 98-33499

(51) Int. Cl.[7] .................................................. H01L 29/76
(52) U.S. Cl. ..................... 257/335; 257/335; 257/338; 257/339; 257/368; 257/369; 257/371
(58) Field of Search .................................. 257/335, 338, 257/339, 368, 369, 371

(56) References Cited

U.S. PATENT DOCUMENTS

| | | | |
|---|---|---|---|
| 4,300,150 | 11/1981 | Colak | 23/357 |
| 4,811,075 | 3/1989 | Eklund | 46/357 |
| 5,317,180 | * 5/1994 | Hutter et al. | 257/337 |
| 5,777,362 | * 7/1998 | Pearce | 257/335 |
| 5,825,065 | * 10/1998 | Corsi et al. | 257/328 |
| 5,859,457 | * 4/1999 | Thiel et al. | 257/335 |
| 5,894,150 | * 4/1999 | Hshieh | 257/335 |
| 5,925,911 | * 7/1999 | Okabe et al. | 257/341 |
| 5,981,998 | * 11/1999 | Frisina et al. | 257/339 |

OTHER PUBLICATIONS

Vladimir Rumennik, "A 1200 V BiCMOS Technology and its Applications", Proceedings of 1992 International Symposium on Power Semiconductor Devices, pp. 322–327.

Stephen P. Robb et al., "Recent Advances in Power Integrated Circuits With High Level Integration", Proceedings of 6th International Symposium on Power Semiconductor Devices, pp. 34–39.

E.H. Stupps et al., "Title Unknown", 1981 IEEE, pp. 17.6–17.8.

Sel Colak, "Effects of Drift Region Parameters on the Static Properties of Power LDMOST", IEEE Transactions on Electron Devices, vol. ED–28, No. 12, Dec. 1981, pp. 1455–1465.

* cited by examiner

Primary Examiner—Eddie C. Lee
Assistant Examiner—Edgardo Ortiz
(74) Attorney, Agent, or Firm—Marger Johnson & McCollomm, P.C.

(57) ABSTRACT

A power DMOS transistor having an improved current driving capability and improved reliability is provided. A fabrication method thereof is also provided. The DMOS transistor includes a semiconductor substrate having a first conductivity type and a semiconductor region having a second conductivity type formed on the semiconductor substrate. A drain having a second conductivity type is formed on the semiconductor region. A high-concentration buried impurity layer having a second conductivity type is formed on the semiconductor region under the drain. A body region having a first conductivity type is formed in the semiconductor substrate spaced a predetermined distance from the semiconductor region. A source having a second conductivity type is formed on the body region. A gate electrode is formed on the semiconductor substrate having a gate insulative film formed thereon. A source electrode and a drain electrode coupled respectively to the source and the drain are formed on the resultant structure.

18 Claims, 8 Drawing Sheets

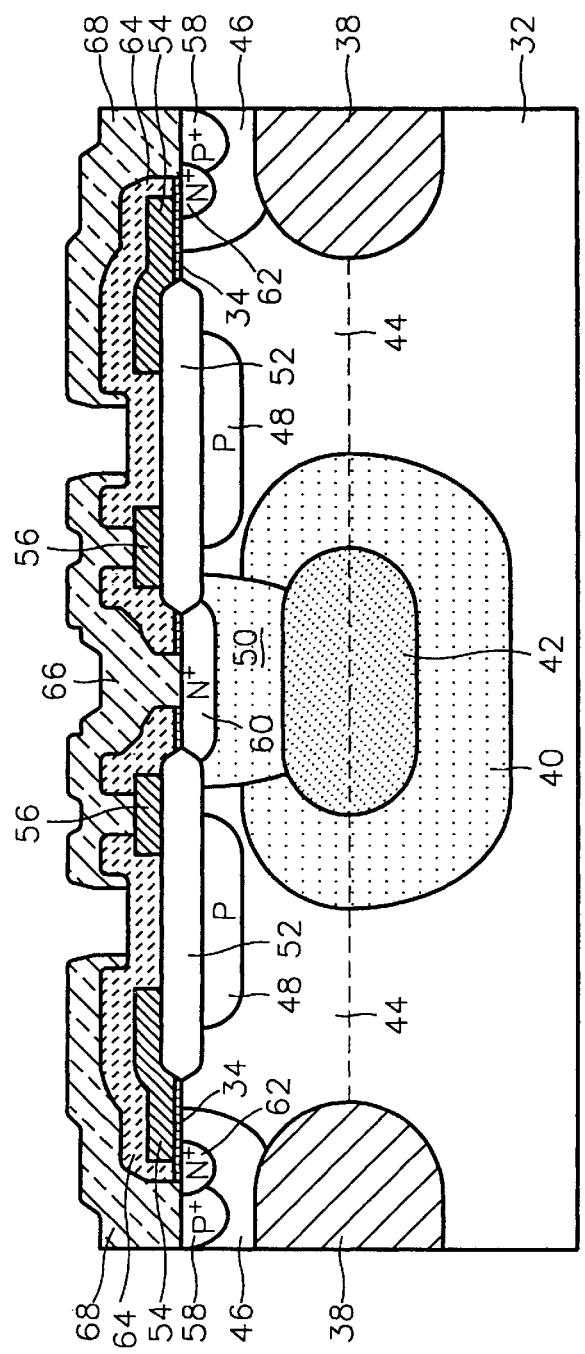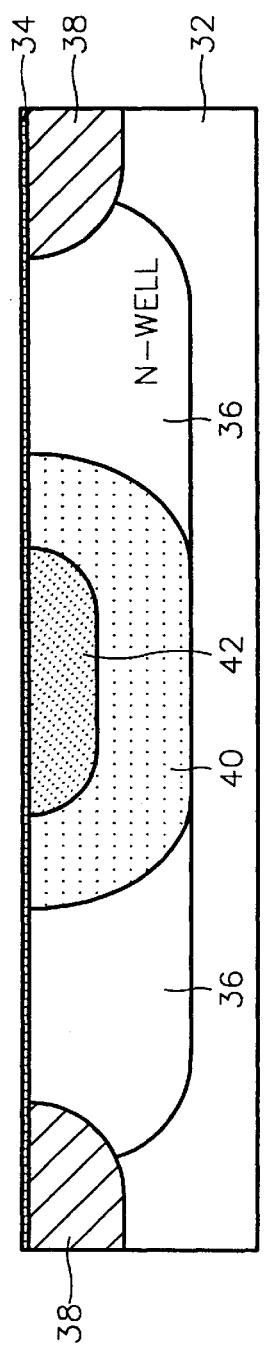
FIG. 5
FIG. 6

DMOS TRANSISTOR HAVING A HIGH RELIABILITY AND A METHOD FOR FABRICATING THE SAME

BACKGROUND OF THE INVENTION

1. Field of the Invention

The present invention relates to a power semiconductor device and, more particularly, to a double diffused MOS field effect (DMOS) transistor having high reliability and a method for fabricating the same.

2. Description of the Related Art

A conventional MOS field effect transistor (MOSFET) has the following advantages compared to a bipolar transistor when both are used for power devices. First, the power MOSFET has a high input impedance providing a high power gain using a simple gate driving circuit. Second, the power MOSFET is a unipolar device preventing the time delay caused by the accumulation or recombination of minority carriers while the device is turned off. Accordingly, the use of the power MOSFET for a switching mode power supply, a lamp ballast, and a motor driving circuit has grown.

A DMOS transistor using a planar diffusion technique is typically used as the power MOSFET. FIG. 1 is a cross-sectional view of a conventional DMOS transistor. Referring to FIG. 1, an N-type well 4 having a single concentration is formed on a P-type semiconductor substrate 2. A drain 6 doped with a high concentration of N-type impurities is formed in the N-type well 4. A P-type body region 8 is formed in the semiconductor substrate 2 spaced at a predetermined distance from the N-type well 4. A P$^+$ impurity region 10 for controlling the bias of the body region and a source 12 doped with a high concentration of N-type impurities are formed adjacent each other within the body region 8.

A field insulative film 14 for providing isolation between devices is formed on the semiconductor substrate 2. A gate electrode 18 is formed on the semiconductor substrate 2. A gate insulative film 16 is formed between the gate electrode 18 and the semiconductor substrate 2. An interlayer insulative film 20 for insulating the transistor from other conductive layer is formed on the resultant stricture. A drain electrode 22 coupled to the drain 6 and a source electrode 24 coupled to the source 12 and the P$^+$ impurity region 10 are formed through contact holes formed in the interlayer insulative film 20.

According to the conventional DMOS, since the N well 4 has a single concentration profile, an electric field crowds at the edges of the drain 6 or gate electrode 18 on the semiconductor substrate when a high voltage is applied to the drain 6 causing breakdown to occur even at a low voltages. Also, because of the segregation of ion-implanted impurities into the N well 4 when the field oxide film 14 is formed, the impurity concentration at the lower portion of the field oxide film 14 is higher than that of a bulk region. Thus, an electric field crowds at the lower portion of the field oxide film 14 causing breakdown to occur when the DMOS is not completely depleted.

To counteract this phenomenon, the conventional DMOS transistor shown in FIG. 2 has been proposed. The same reference numerals denote the same members or regions in FIGS. 1–3. Referring to FIG. 2, a P-type impurity region 26 is formed in the N well 4 under the field oxide film 14. Doing so, provides a high breakdown voltage by preventing a high concentration of impurities at the lower portion of the field oxide film 14 due to segregation of impurities during the forming of the field oxide film 14. However, the current characteristics are considerably degraded compared to the DMOS of FIG. 1.

FIG. 3 is a cross-sectional view of still another conventional DMOS transistor. The DMOS transistor shown prevents breakdown in the structures of FIGS. 1 and 2 caused by electric field concentration at the edges of a drain electrode. Referring to FIG. 3, a polysilicon field plate 28 is formed on the field oxide film 14 corresponding to the edges of the drain 6. The field plate 28 prevents concentration of the electric field at the edges of the drain electrode 22 of FIG. 1 allowing a higher breakdown voltage to be maintained.

The above-described conventional DMOS transistors have large base resistance and large pinch resistance. Because of this, it is difficult to prevent the operation of a parasitic NPN bipolar transistor. Also, breakdown occurs on the surface rather than the bulk of a semiconductor substrate degrading the reliability of the device and requiring an additional device for counteracting the reliability degradation.

Accordingly, a need remains for a DMOS transistor having a high reliability.

SUMMARY OF THE INVENTION

It is an object of the present invention to overcome the problems associated with conventional DMOS transistors.

It is another object of the present invention to provide a DMOS transistor that improves the breakdown voltage characteristics of a device.

It is yet another object of the present invention to provide a DMOS transistor that improves the reliability of the device by preventing breakdown near the surface of the semiconductor substrate.

It is still another object of the present invention to provide a method for fabricating the DMOS transistor.

Accordingly, a DMOS transistor is provided. The DMOS transistor of the present invention comprises a semiconductor substrate having a first conductivity type. A semiconductor region having a second conductivity type is formed on the semiconductor substrate. A drain having the second conductivity type is formed on the semiconductor region. A high concentration buried impurity layer having the second conductivity type is formed on the semiconductor region under the drain. A body region having the first conductivity type is formed on the semiconductor substrate spaced a predetermined distance from the semiconductor region. A source having the second conductivity type formed on the body region. A gate electrode is formed on the semiconductor substrate having a gate insulative film formed thereon. Source and drain electrodes are coupled respectively to the source and the drain.

The DMOS transistor further comprises a sink region having the second conductivity type coupling the drain to the high concentration buried impurity layer. The second conductivity type may be an N type and the drain, the high concentration buried impurity layer, and the sink region have impurity concentrations with a relation of $N^{++} > N^+ > N^0$, respectively.

The power DMOS transistor may include a low concentration buried impurity layer formed below the drain, the low concentration buried impurity layer surrounding the high concentration buried impurity layer. The semiconductor region may also include an epitaxial layer having the second conductivity type. The semiconductor region may comprise a well region having the second conductivity type and an epitaxial layer having the second conductivity type formed on the well region.

The DMOS transistor further comprises a high concentration first impurity region having the first conductivity type formed below the body region and contacting the body region. A field oxide film is formed on the semiconductor region between the drain and the source and a second impurity region having the first conductivity type formed under the field oxide film for improving the breakdown voltage characteristics of the transistor. A third impurity region having the second conductivity type is formed in the body region adjacent to the source, the third impurity region having a higher concentration of impurities than the body region. A conductivity film pattern is formed on the field oxide film at both sides of the drain, the conductivity film pattern serving as a field plate for preventing concentration of an electric field at edges of the drain.

Another embodiment of the DMOS transistor of the present invention comprises a semiconductor substrate having a first conductivity type. A semiconductor region having a second conductivity type is formed on the semiconductor substrate. A drain having the second conductivity type is formed on the semiconductor region. A body region having the first conductivity type is formed on the semiconductor substrate spaced a predetermined distance from the semiconductor region. A source having the second conductivity type is formed on the body region. A high concentration first impurity region having the first conductivity type contacts a bottom surface of the body region. A gate electrode is formed on the semiconductor substrate having a gate insulative film formed thereon and source and drain electrode are connected respectively to the source and the drain.

A third impurity region having the first conductivity type and a higher concentration of impurities than the body region may be formed adjacent to the source.

A high concentration buried impurity layer having the second conductivity type may be formed on the semiconductor region under the drain. A sink region having the second conductivity type connects the drain to the high concentration buried impurity layer and a low concentration buried impurity layer formed below the drain and surrounding the high concentration buried impurity layer. The second conductivity type may be an N type and the drain, the high concentration buried impurity layer, and the sink region may have impurity concentrations with a relation of $N^{++}>N^+>N^0$, respectively.

The semiconductor region may include an epitaxial layer having the second conductivity type. The semiconductor region may also comprise a well region having the second conductivity type and an epitaxial layer having the second conductivity type formed on the well region.

The DMOS transistor may further comprise a field oxide film formed on the semiconductor region between the drain and the source and a second impurity region having the first conductivity type formed under the field oxide film for improving the breakdown voltage characteristics of the transistor. A conductivity film pattern is formed on the field oxide film on both sides of the drain for preventing concentration of an electric field at the edges of the drain.

A method for fabricating a DMOS transistor is also provided. The method comprises forming a high concentration buried impurity layer having a second conductivity type buried in a predetermined region of a semiconductor substrate, the semiconductor substrate having a first conductivity type. An epitaxial layer having the second conductivity type is formed on the semiconductor substrate. A body region is formed in a predetermined region of the epitaxial layer. A field oxide film is formed on the epitaxial layer between the buried impurity layer and the body region. A gate is formed overlapping a portion of the body region on one edge of the field oxide film. A source having the second conductivity type is formed in the body region while forming a drain having the second conductivity type in the epitaxial layer between adjacent field oxide films. An interlayer insulative film is formed covering the drain and source and drain and source electrodes are connected respectively to the drain and the source through a contact hole formed in the interlayer insulative film.

BRIEF DESCRIPTION OF THE DRAWINGS

The foregoing and other objects, features, and advantages of the present invention will become more readily apparent from the following detailed description of a prefened embodiment thereof with reference to the attached drawings.

FIG. 5 is a cross-sectional view of a DMOS transistor according to another embodiment of the present invention; and FIGS. 6 through 10 are cross-sectional views illustrating a method for fabricating a DMOS transistor according to an embodiment of the present invention.

DESCRIPTION OF THE PREFERRED EMBODIMENTS

Figure 1:
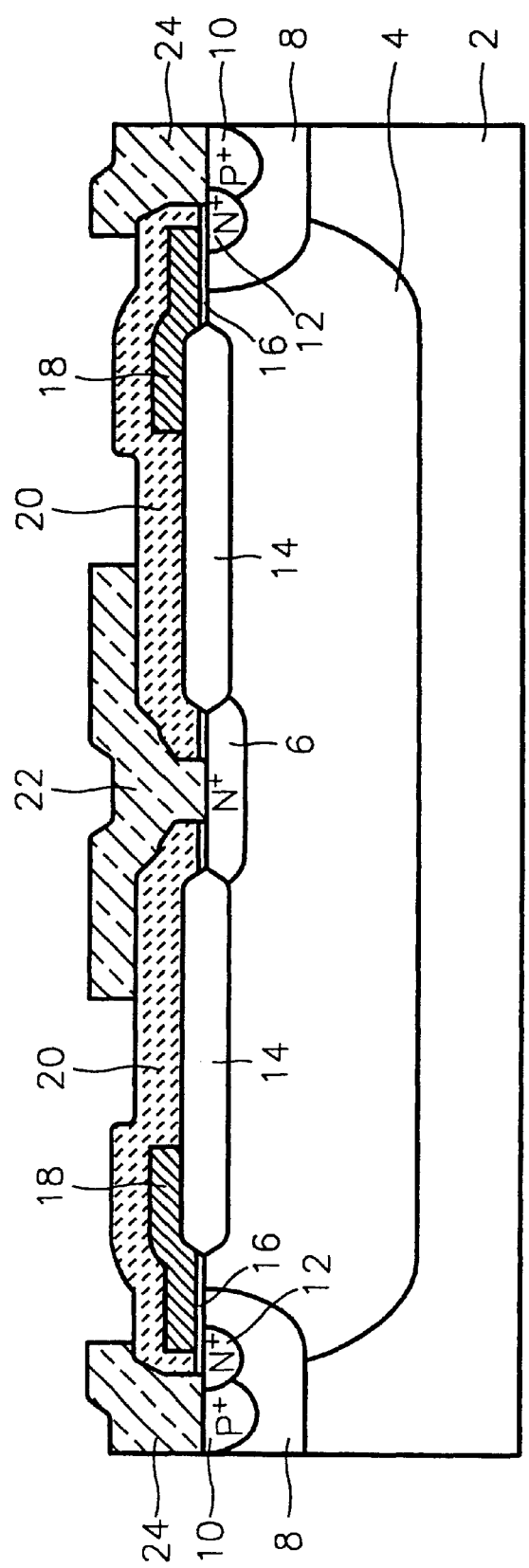
FIG. 1 is a cross-sectional view of a conventional DMOS transistor.
Figure 2:
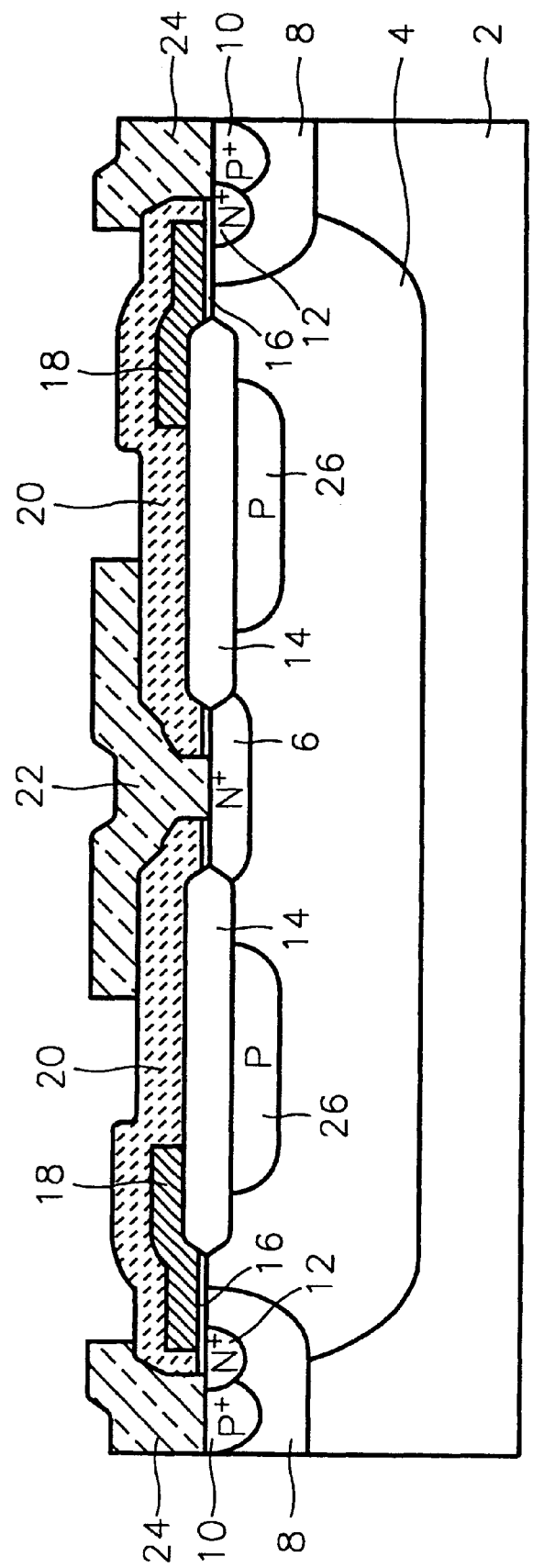
FIG. 2 is a cross-sectional view of another conventional DMOS transistor.
Figure 3:
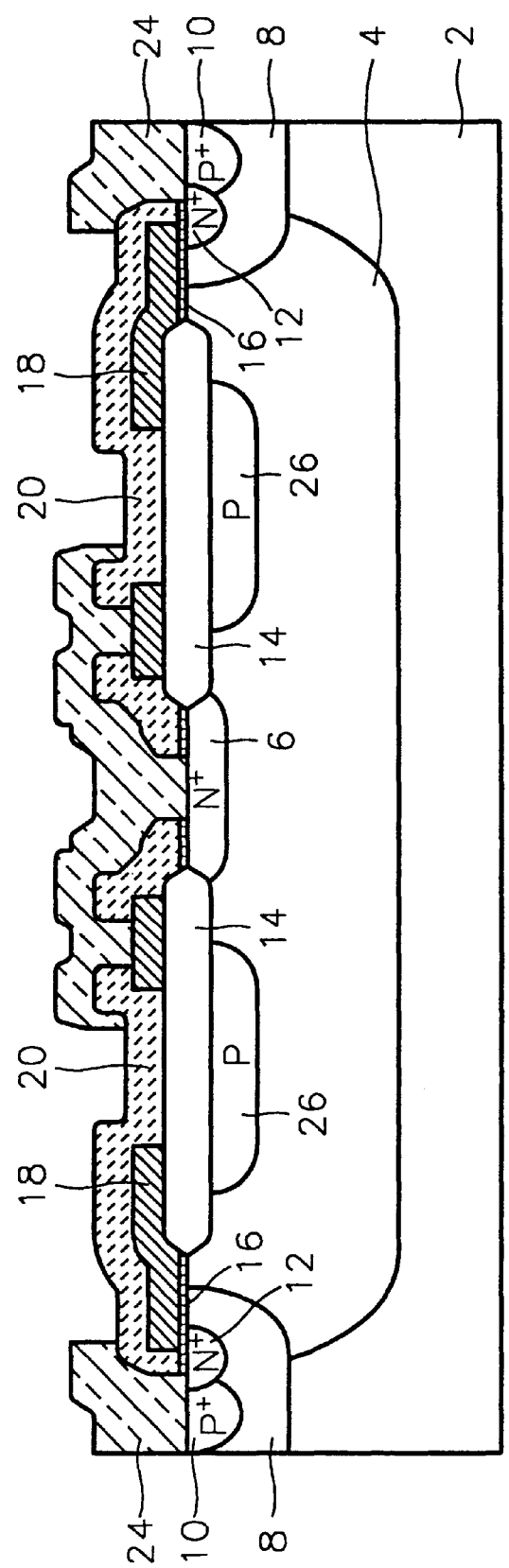
FIG. 3 is a cross-sectional view of still another conventional DMOS transistor.

The embodiments of the present invention arc provided to more completely explain the present invention to those skilled in the art. In the drawings, the thicknesses of layers or regions are exaggerated for clarity. Like reference numerals in the drawings denote the same members. Also, when it is stated that a layer is formed on another layer or a substrate, the layer can be directly on the other layer or the substrate or other layers can intervene therebetween.

Figure 4:
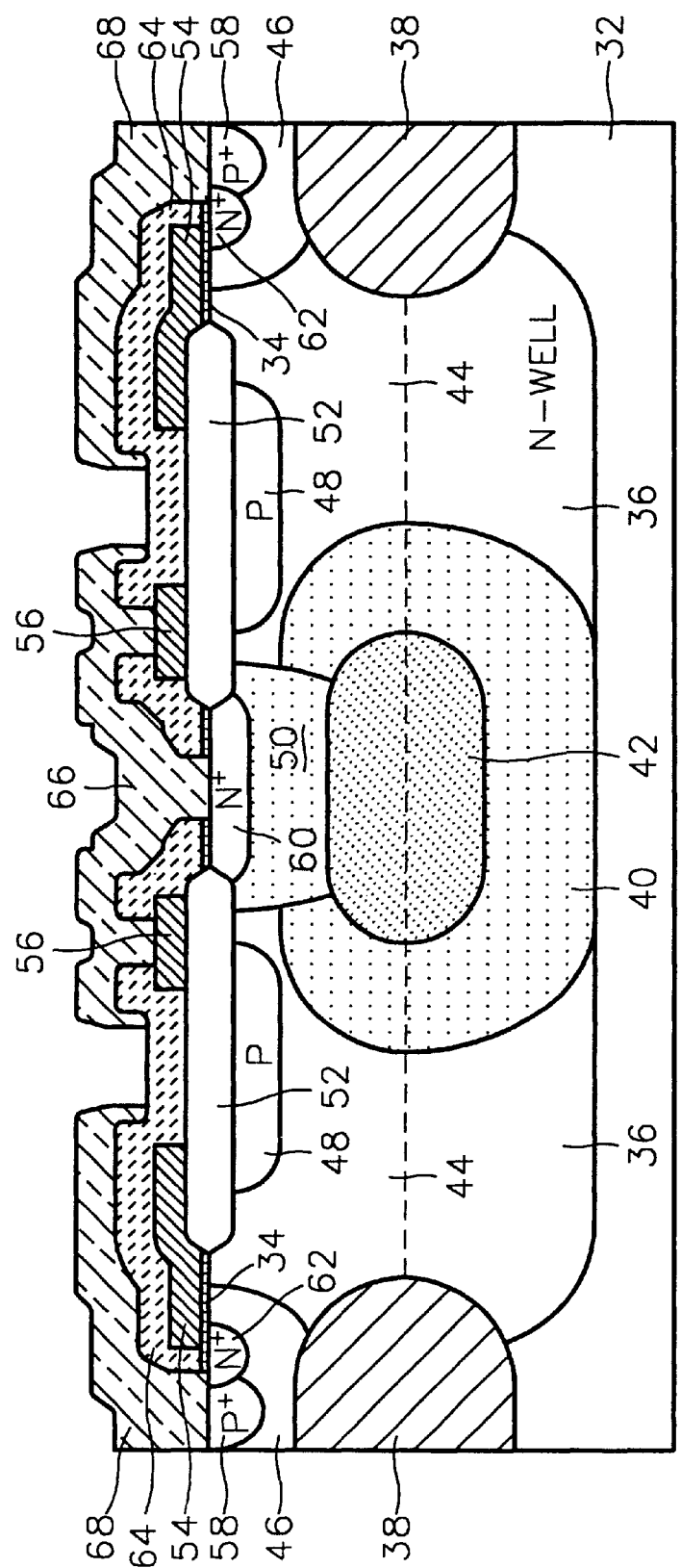
FIG. 4 is a cross-sectional view of a DMOS transistor according to an embodiment of the present invention.

FIG. 4 is a cross-sectional view of a DMOS transistor according to an embodiment of the present invention. Referring to FIG. 4, an N-type well 36 having a single concentration is formed in a P-type semiconductor substrate 32. An N-type epitaxial layer 44 is formed on the N well 36. A drain 60 doped with a high concentration of N-type impurities is formed below the Lipper surface of the epitaxial layer 44. A P-type body region 46 is formed on the semiconductor substrate 32 spaced at a predetermined distance from the N well 36. A P+ impurity region 58 for controlling the bias of the body region and a source 62 doped with a high concentration of N-type impurities are formed adjacent each other in the P-type body region 46. A field insulative film 52 for providing isolation between devices is formed on the semiconductor substrate 32. A P-type impurity region 48 for improving the breakdown voltage properties of a device is formed below the field insulative film 52.

A high concentration P-type lower impurity layer 38 is formed on the bottom surface of the body region 46. An N-type sink region 50, a high-concentration N-type impurity layer 42 coupled to the drain 60 by the sink region 50, and an N⁻ buried impurity layer 40 surrounding the high-concentration N-type impurity layer 50 are formed under the drain 60. It is preferable that the high-concentration P-type lower impurity layer 38 have a P⁺ concentration and the N well region 36, the high-concentration N-type impurity layer 42, and the N⁻ buried impurity layer 40 have N-type concentrations with the relation of N⁻<N<N⁺.

A gate electrode 54 is formed on the semiconductor substrate 32 having a gate insulative film 34 formed thereon. A polysilicon field plate 56 is formed on each field oxide film 52 at both sides of the drain 60 to prevent concentration of the electric field at the edges of the drain. An interlayer insulative film 64 for insulating the transistor from other conductive layers is formed on the resultant structure. A drain electrode 66 coupled to the drain 60 and a source electrode 68 coupled to the source 62 and the P⁺ impurity region 58 is formed through a contact hole formed in the interlayer insulative layer 64.

According to the DMOS transistor of the present invention the high-concentration P-type lower impurity layer 38 is formed below the P-type body region 46 to significantly reduce the body region resistance and pinch resistance compared to conventional DMOS transistors. Thus, latch-up is effectively prevented, reliability of the device is improved, and switching speed is increased. Also, the resistance of the drain is reduced because the high-concentration N-type buried impurity layer 42, the sink region 50, and the N⁻ buried layer 40 are formed under the drain 60. Thus, the capability for driving current is likewise improved.

Furthermore, the concentration profile in a horizontal direction of the resultant device is in the form of P⁺→P⁰→N⁻→N⁰→N⁺ by using the high-concentration N-type buried impurity layer 42 and the high-concentration P-type lower impurity layer 38. Accordingly, breakdown is determined by the distance between the high-concentration N-type buried impurity layer 42 and the high-concentration P-type lower impurity layer 38. Thus, breakdown always occurs on the bulk rather than the surface of the device improving the reliability of the device.

FIG. 5 is a cross-sectional view of a DMOS transistor according to another embodiment of the present invention. The DMOS transistor shown in FIG. 5 is substantially the DMOS transistor shown in FIG. 4 without the N well 36.

FIGS. 6 through 10 are cross-sectional views illustrating a method of fabricating the DMOS transistors shown in FIGS. 4 and 5. Referring to FIG. 6, a pad oxide film 34 is formed by growing a thermal oxide film of about 6000 Å on a P-type semiconductor substrate 32 having a specific resistance of 50 to 100 Ω·m. A nitride film (not shown) of about 1000 Å is formed on the pad oxide film 34. The nitride film is removed by photolithography from a region in which an N well is to be formed. Then, an N-well impurity layer is formed by ion-implanting N-type impurities the N well region.

An oxide film (not shown) is formed in a region where the nitride film has been removed by oxidizing the semiconductor substrate. Simultaneously, an N well 36 is formed by diffusing impurities of the N-well impurity layer. The N well formation process described above may be eliminated to fabricate the DMOS transistor of FIG. 5.

After the nitride film is removed, P-type impurities are ion-implanted using the oxide film as a mask. A high-concentration P-type lower impurity layer 38 is formed by diffusion.

A predetermined region is defined by photolithography, a high concentration of N-type impurities are ion-implanted into this region, and the resultant structure diffuses thereby forming the N⁺ buried layer 42.

After the N⁺ buried layer 42 is formed, a low concentration of N-type impurities are ion-implanted into the semiconductor substrate 32 and the semiconductor substrate 32 together with the N⁺ buried layer 42 are simultaneously diffused. Thus, a process may be added for forming an N⁻ buried layer 40 covering the N⁺ buried layer. When ions having different diffusion coefficients, e.g., phosphorus (P) and arsenic (As), are implanted, a buried layer having a nonuniform depth may be formed as shown in FIG. 6.

Figure 7:
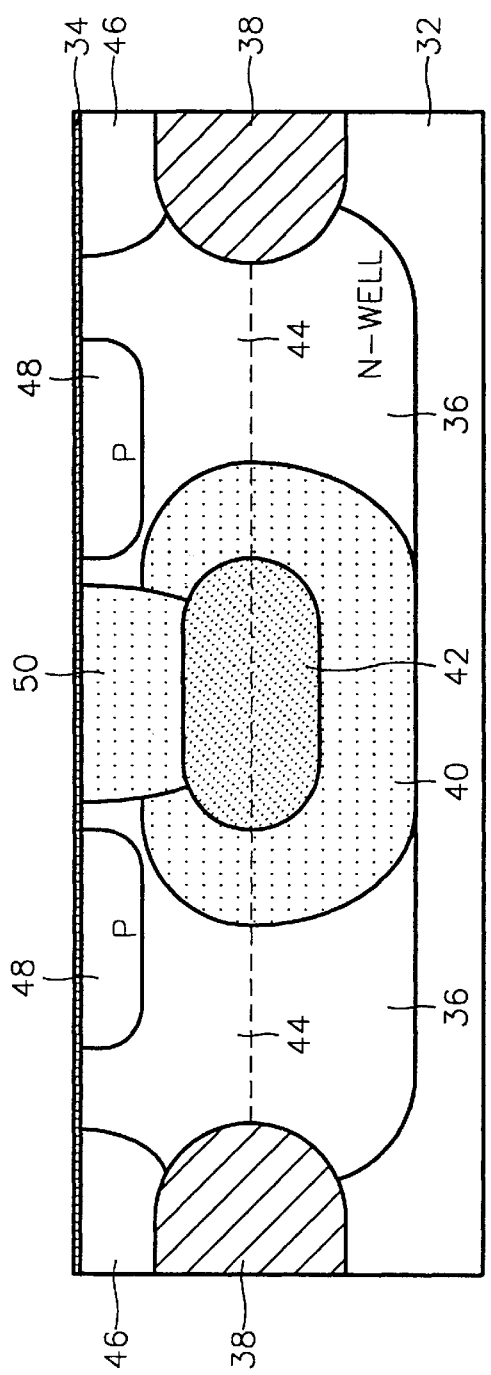

Referring to FIG. 7, a N-type epitaxial layer 44 is formed on the resultant structure of FIG. 6 by a typical epitaxial growth method. Here, impurities of the N⁻buried layer 40, N⁺ buried layer 42, and the high-concentration P-type lower impurity layer 38 are diffused upward thereby providing a shape as shown in FIG. 7.

A region in which a body region is to be formed is defined using conventional photolithography. P-type impurities are ion-implanted into the defined region thereby forming an impurity layer for forming the body region. To maintain the device at a high breakdown voltage and prevent generation of breakdown on the surface of the epitaxial layer, an impurity layer for a P-type impurity region is formed using conventional photolithogralhic and ion-implantation processes. The photolithographic and ion-implantation processes for forming the body region and the P-type impurity region can be performed simultaneously.

A predetermined region in which N-type impurities are to be implanted is defined by photolithography. N-type impurities are ion-implanted into this predetermined region thereby forming an impurity layer for forming an N-type sink region. Here, the sink region may not be formed as needed.

Impurities of the impurity layers are diffused by a thermal treatment at a predetermined temperature thereby forming the body region 46, the P-type impurity region 48 for preventing breakdown, and the N-type sink region 50. At this time, the body region 46 and the N-type sink region 50 contact respectively the high-concentration P-type lower impurity layer 38 and the N⁺ buried layer 42 (FIG. 7), by appropriately controlling the energy for ion implantation, a thermal treatment temperature, and a thermal treatment time.

Figure 8:
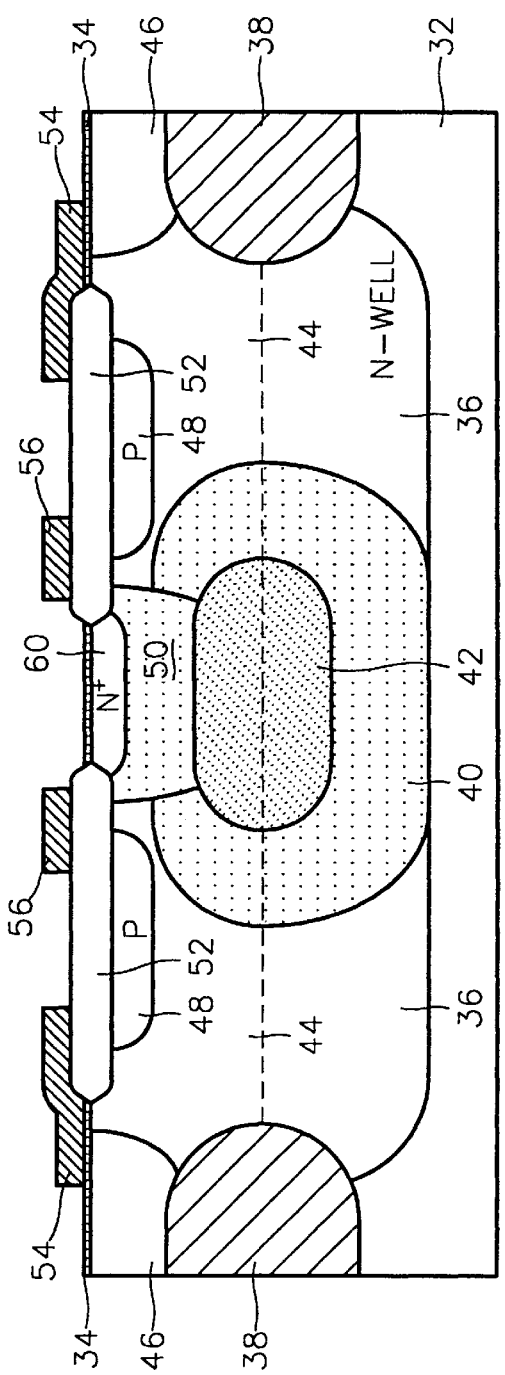

Referring to FIG. 8, a mask nitride film (not shown) is formed on the entire surface of the resultant structure of FIG. 7. The nitride film is patterned by photolithography exposing a predetermined region of the semiconductor substrate. A field oxide film 52 is formed in the exposed region. The nitride film is removed, polysilicon is deposited on the entire surface of the resultant stricture, and a polysilicon film is doped with POCl₃. A gate electrode 54 is formed by patterning the polysilicon using photolithography at the same time a plate 56 for preventing concentration of an electric field at the edges of the drain is formed on one end of the field oxide film 52.

Figure 9:
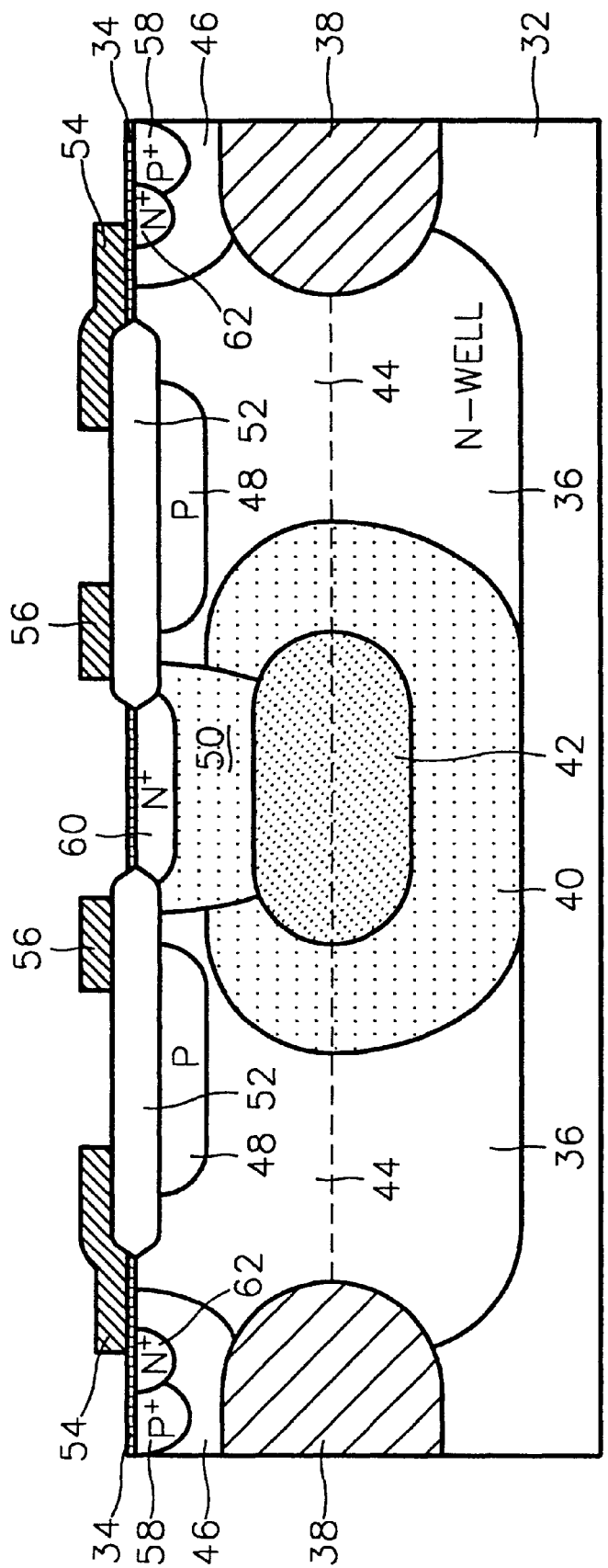

Referring to FIG. 9, a P⁺ impurity region 58 for controlling the bias of the body region is formed using photolithography and ion-implantation. A region in which a source and a drain are to be formed is defined by photolithography. A high concentration of N-type impurities are ion-implanted into the defined region thereby forming a drain impurity layer and a source impurity layer.

Figure 10:
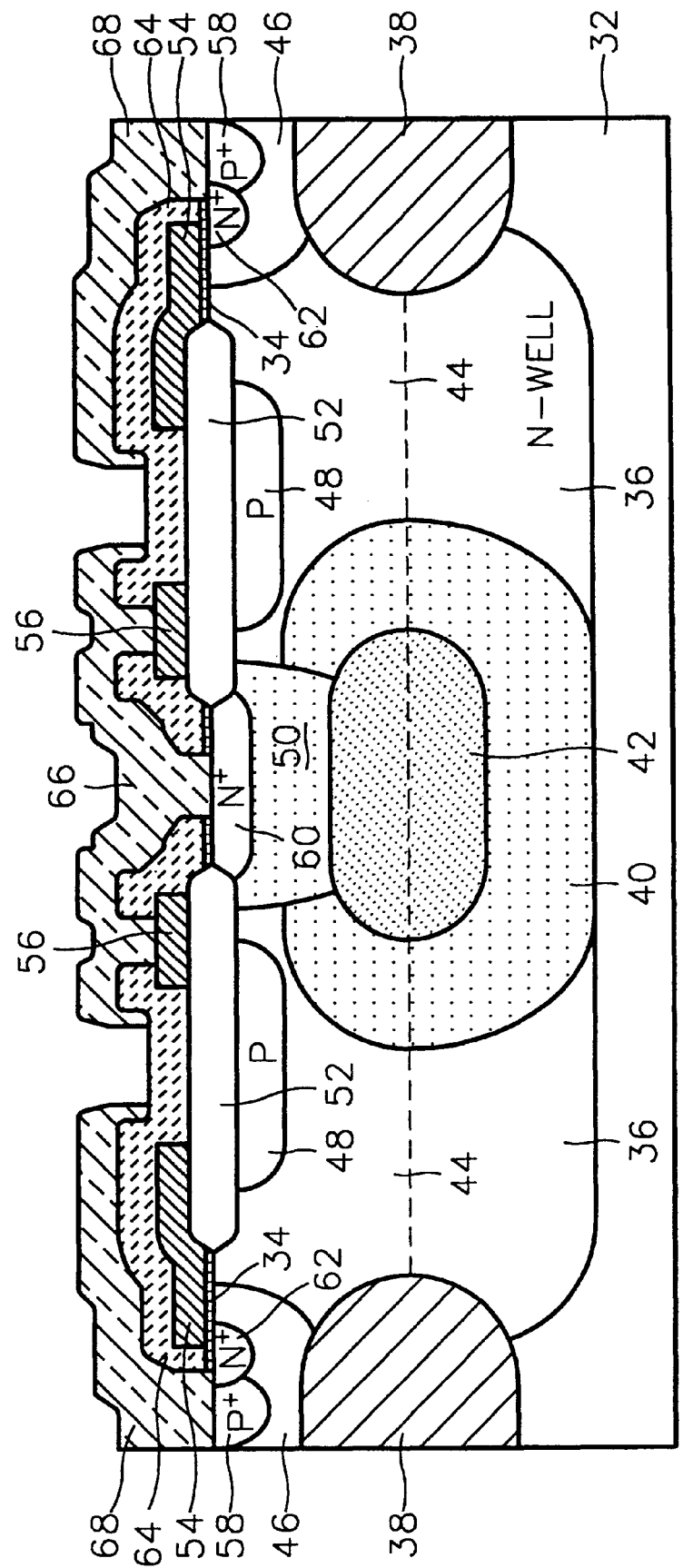

Referring to FIG. 10, for example, an oxide film is deposited and densified on the entire surface of the resultant structure of FIG. 9. A flowable oxide film such as a low temperature oxide film or boron-phosphorus containing oxide film (BPSG) is deposited and reflowed forming an interlayer insulative film 64. Impurities of the drain and source impurity are diffused using a thermal process that reflows the flowable oxide film thereby forming an N⁺ drain 60 and an N⁺ source 62. A part of the interlayer insulative film 64 is etched by photolithography exposing parts of the source and drain. A metal is deposited on the resultant stricture and patterned thereby forming a drain electrode 66 and a source electrode 68.

The above-described DMOS transistor and the fabrication method thereof according to the present invention have the following advantages. First, since the high-concentration P-type lower impurity layer 38 is formed below the P-type body region 46, the resistance of the body region and the pinch resistance arc considerably reduced compared to the conventional DMOS transistors allowing an effective prevention of latch up, a reliable device, and fast switching. Second, since the N⁺ buried layer 42 is formed under the drain 60, the resistance of the drain is reduced and the current driving capability is improved. Third, the concentration profile in the horizontal direction of the resultant device is in the form of $P^+ \rightarrow P^0 \rightarrow N^- \rightarrow N^0 \rightarrow N^+$ using the high-concentration N⁺ buried layer 42 and the high-concentration P⁺ lower impurity layer 38. Accordingly, breakdown is determined by the distance between the N⁺ buried layer and the P⁺ lower impurity layer and thus always occurs in the bulk rather than on the surface of the device thereby improving the reliability of the device.

Having illustrated and described the principles of my invention in a preferred embodiment thereof, it should be readily apparent to those skilled in the art that the invention can be modified in arrangement and detail without departing from such principles. I claim all modifications coming within the spirit of the accompanying claims.

What is claimed is:

1. A power DMOS transistor, comprising:
   a semiconductor substrate having a first conductivity type;
   a semiconductor region having a second conductivity type formed on the semiconductor substrate;
   a drain having the second conductivity type formed on the semiconductor region;
   a first buried impurity layer having the second conductivity type formed on the semiconductor region under the drain;
   a second buried impurity layer having the second conductivity type formed to substantially surround the first buried impurity layer, the first buried impurity layer having a concentration higher than a concentration of the second buried impurity layer;
   a body region having the first conductivity type formed on the semiconductor substrate spaced a predetermined distance from the semiconductor region;
   a source having the second conductivity type formed on the body region;
   a gate electrode formed on the semiconductor substrate having a gate insulative film formed thereon; and
   a source and drain electrodes coupled respectively to the source and the drain.

2. The power DMOS transistor of claim 1 including a sink region having the second conductivity type positioned between the drain and first buried impurity layer.

3. A power DMOS transistor, comprising:
   a semiconductor substrate having a first conductivity type;
   a semiconductor region having a second conductivity type formed on the semiconductor substrate;
   a drain having the second conductivity type formed on the semiconductor region;
   a high concentration buried impurity layer having the second conductivity type formed on the semiconductor region substantially under the drain;
   a body region having the first conductivity type formed on the semiconductor substrate spaced a predetermined distance from the semiconductor region;
   a source having the second conductivity type formed on the body region;
   a gate electrode formed on the semiconductor substrate having a gate insulative film formed thereon;
   a source and drain electrodes coupled respectively to the source and the drain; and
   a sink region having the second conductivity type coupling the drain to the high concentration buried impurity layer;
   wherein the second conductivity type is an N type and the high concentration buried impurity layer, the drain, and the sink region have impurity concentrations with a relation of $N^{++} > N^+ > N^0$, respectively.

4. The power DMOS transistor of claim 1 wherein the semiconductor region includes an epitaxial layer having the second conductivity type.

5. The power DMOS transistor of claim 1 wherein the semiconductor region comprises:
   a well region having the second conductivity type; and
   an epitaxial layer having the second conductivity type formed on the well region.

6. The power DMOS transistor of claim 1 including a first impurity region having the first conductivity type formed below the body region and contacting the body region.

7. The power DMOS transistor of claim 6 including:
   a field oxide film formed on the semiconductor region between the drain and the source; and
   a second impurity region having the first conductivity type formed under the field oxide film, the first impurity region having a higher impurity concentration than an impurity concentration of the second impurity region.

8. The power DMOS transistor of claim 7 including a third impurity region having the second conductivity type formed in the body region adjacent to the source, the third impurity region having a higher concentration of impurities than the body region.

9. A power DMOS transistor, comprising:
   a semiconductor substrate having a first conductivity type;
   a semiconductor region having a second conductivity type formed on the semiconductor substrate;
   a drain having the second conductivity type formed on the semiconductor region;
   a high concentration buried impurity layer having the second conductivity type formed on the semiconductor region under the drain;
   a body region having the first conductivity type formed on the semiconductor substrate spaced a predetermined distance from the semiconductor region;
   a source having the second conductivity type formed on the body region;
   a gate electrode formed on the semiconductor substrate having a gate insulative film formed thereon;
   a source and drain electrodes coupled respectively to the source and the drain
   a first impurity region having the first conductivity type formed below the body region and contacting the body region;

a field oxide film formed on the semiconductor region between the drain and the source;

a second impurity region having the first conductivity type formed under the field oxide film, the first impurity region having a higher impurity concentration than an impurity concentration of the second impurity region; and a conductivity film pattern formed on the field oxide film at both sides of the drain.

10. A power DMOS transistor, comprising:

a semiconductor substrate having a first conductivity type;

a semiconductor region having a second conductivity type formed on the semiconductor substrate;

a drain having the second conductivity type formed on the semiconductor region;

a body region having the first conductivity type formed on the semiconductor substrate spaced a predetermined distance from the semiconductor region;

a source having the second conductivity type formed on the body region;

a first impurity region having the first conductivity type and formed to contact a bottom surface of the body region, the first impurity region having a high impurity concentration relative to body region;

a gate electrode formed on the semiconductor substrate having a gate insulative film formed thereon; and a source and drain electrode connected respectively to the source and the drain.

11. The power DMOS transistor of claim 10 comprising a second impurity region having the first conductivity type and formed adjacent to the source and above the first impurity region, the second impurity region having a higher concentration of impurities than the body region.

12. The power DMOS transistor of claim 10 comprising a high concentration buried impurity layer having the second conductivity type formed on the semiconductor region under the drain.

13. The power DMOS transistor of claim 12 comprising:

a sink region having the second conductivity type for connecting the drain to the high concentration buried impurity layer; and a low concentration buried impurity layer formed below the drain and surrounding the high concentration buried impurity layer.

14. A power DMOS transistor, comprising:

a semiconductor substrate having a first conductivity type;

a semiconductor region having a second conductivity type formed on the semiconductor substrate;

a drain having the second conductivity type formed on the semiconductor region;

a body region having the first conductivity type formed on the semiconductor substrate spaced a predetermined distance from the semiconductor region;

a source having the second conductivity type formed on the body region;

a high concentration first impurity region having the first conductivity type contacting a bottom surface of the body region;

a gate electrode formed on the semiconductor substrate having a gate insulative film formed thereon;

a source and drain electrode connected respectively to the source and the drain;

a high concentration buried impurity layer having the second conductivity type formed on the semiconductor region under the drain;

a sink region having the second conductivity type for connecting the drain to the high concentration buried impurity layer; and a low concentration buried impurity layer formed below the drain and surrounding the high concentration buried impurity layer;

wherein the second conductivity type is an N type and the drain, the high concentration buried impurity layer, and the sink region have impurity concentrations with a relation of $N^{++} > N^{+} > N^{0}$, respectively.

15. The power DMOS transistor of claim 10 wherein the semiconductor region includes an epitaxial layer having the second conductivity type.

16. The power DMOS transistor of claim 10 wherein the semiconductor region comprises:

a well region having the second conductivity type; and an epitaxial layer having the second conductivity type formed on the well region.

17. The power DMOS transistor of claim 10 comprising:

a field oxide film formed on the semiconductor region between the drain and the source; and a second impurity region having the first conductivity type formed under the field oxide film.

18. A power DMOS transistor, comprising:

a semiconductor substrate having a first conductivity type;

a semiconductor region having a second conductivity type formed on the semiconductor substrate;

a drain having the second conductivity type formed on the semiconductor region;

a body region having the first conductivity type formed on the semiconductor substrate spaced a predetermined distance from the semiconductor region;

a source having the second conductivity type formed on the body region;

a high concentration first impurity region having the first conductivity type contacting a bottom surface of the body region;

a gate electrode formed on the semiconductor substrate having a gate insulative film formed thereon;

a source and drain electrode connected respectively to the source and the drain;

a field oxide film formed on the semiconductor region between the drain and the source;

a second impurity region having the first conductivity type formed under the field oxide film for improving the breakdown voltage characteristics of the transistor; and a conductivity film pattern formed on the field oxide film on both sides of the drain.

* * * * *

UNITED STATES PATENT AND TRADEMARK OFFICE
CERTIFICATE OF CORRECTION

PATENT NO. : 6,252,279 B1
DATED : June 26, 2001
INVENTOR(S) : Kim

It is certified that error appears in the above-identified patent and that said Letters Patent is hereby corrected as shown below:

Column 1,
Line 44, "stricture" should read -- structure --.

Column 4,
Line 19, "prefened" should read -- preferred --.
Line 40, "arc" should read -- are --.
Line 54, "Lipper" should read -- upper --.

Column 5,
Line 3, "layer 50" should read -- layer 52 --.

Column 6,
Line 25, "photolithogralhic" should read -- photolithographic --.
Line 51, "stricture" should read -- structure --.

Column 7,
Line 8, "stricture" should read -- structure --.
Line 15, "arc" should read -- are --.

Signed and Sealed this

Twenty-sixth Day of November, 2002

Attest:

JAMES E. ROGAN
Attesting Officer
Director of the United States Patent and Trademark Office